(12) United States Patent
Deczky

(10) Patent No.: US 7,600,178 B2
(45) Date of Patent: Oct. 6, 2009

(54) METHODS FOR THE DETERMINATION OF FEC PARAMETERS IN DMT BASED XDSL SYSTEMS IN THE PRESENCE OF SYSTEM IMPOSED CONSTRAINTS

(75) Inventor: Andrew G. Deczky, Ottawa (CA)

(73) Assignee: Ciena Corporation, Linthicum, MD (US)

( * ) Notice: Subject to any disclaimer, the term of this patent is extended or adjusted under 35 U.S.C. 154(b) by 611 days.

(21) Appl. No.: 11/249,088

(22) Filed: Oct. 12, 2005

(65) Prior Publication Data

US 2006/0107170 A1    May 18, 2006

Related U.S. Application Data

(60) Provisional application No. 60/617,047, filed on Oct. 12, 2004.

(51) Int. Cl.
*H03M 13/03*    (2006.01)
(52) U.S. Cl. .................. 714/786; 714/774; 375/219; 375/227
(58) Field of Classification Search ............... 714/786, 714/774; 375/219
See application file for complete search history.

(56) References Cited

U.S. PATENT DOCUMENTS

| 6,480,475 | B1 * | 11/2002 | Modlin et al. ........... 370/294 |
| 6,801,570 | B2 * | 10/2004 | Yong ...................... 375/219 |
| 7,409,626 | B1 * | 8/2008 | Schelstraete ............ 714/774 |
| 2001/0048667 | A1 * | 12/2001 | Hamdi .................... 370/252 |
| 2008/0232444 | A1 * | 9/2008 | Tzannes .................. 375/219 |

* cited by examiner

*Primary Examiner*—Guy J Lamarre
*Assistant Examiner*—Sam Rizk
(74) *Attorney, Agent, or Firm*—Clements Bernard PLLC; Christopher L. Bernard; Tyler S. Brown

(57) ABSTRACT

The present invention provides procedures for computing Forward Error Correction (FEC) parameters given a set of constraints on maximum interleaver memory, maximum interleaver depth, maximum codeword size, maximum number of check bytes, maximum number of FEC codewords per Discrete Multi-Tone (DMT) symbol, and minimum number of DMT symbols that the FEC must correct, as well as any constraints imposed by the interleaver. These procedures are implemented on a computational engine in a modem, enabling it to achieve optimal performance in all cases. In addition these procedures can be applied as part of any bit loading algorithm to determine the optimal FEC parameters, taking into account the Signal-to-Noise Ratio (SNR) profile, the FEC coding gain, the constraints of the framer, and any application specific constraints.

27 Claims, No Drawings

METHODS FOR THE DETERMINATION OF FEC PARAMETERS IN DMT BASED XDSL SYSTEMS IN THE PRESENCE OF SYSTEM IMPOSED CONSTRAINTS

CROSS-REFERENCE TO RELATED APPLICATION(S)

The present non-provisional patent application claims the benefit of priority of U.S. Provisional Patent Application No. 60/617,047, entitled "DETERMINATION OF FEC PARAMETERS IN DMT BASED xDSL SYSTEMS IN THE PRESENCE OF SYSTEM IMPOSED CONSTRAINTS," and filed on Oct. 12, 2004, which is incorporated in full by reference herein.

FIELD OF THE INVENTION

The present invention relates generally to improved methods for the determination of Forward Error Correction (FEC) parameters in Discrete Multi-Tone (DMT) based Digital Subscriber Line (xDSL) systems (e.g. modems) that use FEC and convolutional interleaving to combat impulse noise in the presence of system imposed constraints.

BACKGROUND OF THE INVENTION

Conventional high speed communications on copper media (e.g. standard telephone lines) use DMT technology and are bundled under the umbrella of xDSL. There are several variants of this technology currently deployed, namely Asymmetric Digital Subscriber Line (ADSL), ADSL2, ADSL2plus, and Very High Speed Digital Subscriber Line (VDSL). Some of these technologies are standardized by the International Telecommunications Union, Geneva, (ITU) as follows: "ITU-T Recommendation G992.1, Asymmetric Digital Subscriber Line (ADSL)," "ITU-T Recommandation G992.3, Asymmetric Digital Subscriber Line Transceivers 2 (ADSL2)," "ITU-T Recommendation G992.5, Asymmetric Digital Subscriber Line (ADSL) Transceivers—Extended Bandwidth ADSL2 (ADSL2plus)," and "ITU-T Recommendation G993.1, Very High Speed Asymmetric Digital Subscriber Line (VDSL) Transceivers." These and other systems are the subject of ongoing and future standardization efforts.

One key feature of such xDSL modems is the use of FEC to combat the effects of impulse noise on the lines. The FEC used is typically the well known Reed Solomon code, with a maximum codeword size of 255 bytes. These coders add redundancy to data by appending R check bytes to each block of data, allowing for the correction of R/2 random errors per block, where:

$$N=K+R,$$

and there are K data bytes and R check bytes in each codeword block of N bytes.

In order to enhance the effectiveness of error correction, a convolutional interleaver is added to spread the error pattern over many DMT symbols, thus allowing for the correction of such errors without introducing excessive redundancy and, hence, overhead. The convolutional interleaver has the following property:

$$\Delta_j = (D-1)j, j=1,\ldots,I-1,$$

where,
$\Delta_j$ is the distance between two interleaved bytes,
D is the interleaver depth, and
I is the interleaver block size.

A necessary condition of such an interleaver is that D and I must be co-prime (i.e. have no common divisor). This has been enforced in different ways:

in ADSL $D=2^n$ I=N=odd integer, and in VDSL $D=M \cdot I+1$ with $N=q \cdot I$, where q is an integer fraction. Finally, a generalized interleaver has also been considered where:

in any DSL $D=M \cdot I+x$ with $N=q \cdot I x=1,\ldots,I-1$, with the constraint that x is chosen such that D and I are mutually co-prime. Generally, these conditions place one constraint on the choice of D and N.

In a DMT modem, the data is broken into frames and transmitted on a set of discrete tones in each frame, also called a DMT symbol. In xDSL, the frame or symbol rate is typically 4 kHz. The number of DMT symbols per FEC codeword is a variable designated as S in the standards. Traditionally, S is an integer or an integer fraction, but more recent standards have relaxed this to allow non-integer values of S. However, the minimum value of S is limited to some specified value $S_{min}$, which effectively limits the number of times the FEC decoder is run every DMT frame and has a direct influence on complexity and cost. This leads to a second constraint on the choice of FEC parameters.

The convolutional interleaver was introduced to combat impulse noise. Due to the nature of DMT modems, any impulse noise corrupts at least one whole DMT frame of data. This leads to the definition of a parameter, $INP_{min}$, that specifies how many DMT frames (symbols) the FEC must correct. This defines a third constraint on the choice of FEC parameters.

Other possible constraints on the choice of FEC parameters include the delay introduced by the interleaver, defined as MaxLatency, and the total memory required, defined a MaxMemory.

A DMT modem is required to allocate the bits in an input stream to the tones in a DMT frame. This process is known as bit allocation, and is based on the Signal-to-Noise Ratio (SNR) per tone, using well known algorithms based on the relationship:

$$\text{bits}_i=\text{round}((snr(\text{tone}_i)-snr\text{Gap}-\text{margin}+cg)/3),$$

where snr is expressed in dB, the snrGap is approx 9.7 dB, margin is a noise margin parameter, and cg is any coding gain. All bit allocation algorithms are required to take into account any coding gain introduced by the FEC, which is a function of the FEC parameters. This leads to an iterative solution where a first set of FEC parameters is determined assuming no FEC coding gain, and the parameters are adjusted to take into account the coding gain for the chosen FEC parameters. This process is repeated until no difference is observed. Thus, the final outcome is a process for choosing both the bit allocation and the FEC parameters using a computational engine on the modem to achieve optimum performance in the presence of all of the specified constraints.

In conventional implementations, the determination of the optimal FEC parameters is by some form of search over a large set of possible values in order to satisfy all of the constraints.

BRIEF SUMMARY OF THE INVENTION

In various embodiments, the present invention provides procedures for computing FEC parameters given a set of constraints on maximum interleaver memory, maximum interleaver depth, maximum codeword size, maximum number of check bytes, maximum number of FEC codewords per DMT symbol, and minimum number of DMT symbols that the FEC must correct, as well as any constraints imposed by the interleaver. These procedures are implemented on a computational engine in a modem, enabling it to achieve optimal performance in all cases.

In addition these procedures can be applied as part of any bit loading algorithm to determine the optimal FEC parameters, taking into account the SNR profile, the FEC coding gain, the constraints of the framer, and any application specific constraints, as described above.

In one embodiment of the present invention, a method for the determination of Forward Error Correction (FEC) parameters in a Discrete Multi-Tone (DMT) based Digital Subscriber Line (xDSL) system includes providing an initial value for each of R (number of check bytes), N (codeword size in bytes), and D (interleaver depth in bytes); providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and determining a constrained value for each of R, N, and D based upon the set of constraints.

In another embodiment of the present invention, a Discrete Multi-Tone (DMT) based Digital Subscriber Line (xDSL) system includes a processor operable for determining Forward Error Correction (FEC) parameters, the processor including a first algorithm operable for providing an initial value for each of R (number of check bytes), N (codeword size in bytes), and D (interleaver depth in bytes); a second algorithm operable for providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and a third algorithm operable for determining a constrained value for each of R, N, and D based upon the set of constraints.

In a further embodiment of the present invention, a processor operable for determining Forward Error Correction (FEC) parameters includes a first algorithm operable for providing an initial value for each of R (number of check bytes), N (codeword size in bytes), and D (interleaver depth in bytes); a second algorithm operable for providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and a third algorithm operable for determining a constrained value for each of R, N, and D based upon the set of constraints.

DETAILED DESCRIPTION OF THE INVENTION

Using the naming convention developed in G.992.3, described above, it can be written:

$$INP = \frac{R \cdot S \cdot D}{2 \cdot N} DMT \text{ symbols,}$$

$$\text{Latency} = \frac{S \cdot D}{4} \text{ms,}$$

$$LineRate = lr = \frac{32 \cdot N}{S} kb/s, \text{ and}$$

$$DataRate = dr = \frac{32 \cdot (N - R)}{S} kb/s,$$

where:
  lr is the data rate including coding overhead in kbits/sec,
  dr is the net data rate available to carry data in kbits/sec,
  N is the size of the Reed Solomon codeword in bytes,
  R is the number of check bytes and is even,
  D is the interleaver depth in bytes, and
  S is the number of DMT symbols per FEC codeword.
The following parameters are further defined:
  $lr_{max}$ is the maximum data rate that can be transmitted in kbits/sec,
  $S_{min}$ is the minimum value of S,
  mem=D·N is a parameter designated as the interleaver memory in bytes,
  $INP_{min}$ is the minimum number of DMT symbols in error that must be corrected, and
  $Latency_{max}$ is the maximum allowed latency (delay) of the modem in milliseconds.

First, considering the case where there is no constraint on $D_{max}$ and $S_{min}$, the following two relationships are considered:

$$dr = \frac{32}{S}(N - R)$$

$$INP = \frac{S \cdot R \cdot D}{2 \cdot N}.$$

Next, the parameters $$\beta = \frac{R}{N}$$

and use mem=D·N are introduced. Rearranging the second equation as:

$$\frac{N}{S} = \frac{D \cdot R}{2 \cdot INP} = \frac{D \cdot N \cdot R}{2 \cdot N \cdot INP} = \frac{mem \cdot \beta}{2 \cdot INP}.$$

Substituting in the first equation:

$$dr = \frac{32 \cdot N}{S}(1 - \beta) = \frac{32 \cdot mem \cdot \beta}{2 \cdot INP}(1 - \beta) = \frac{16 \cdot mem}{INP}\beta(1 - \beta).$$

It should be noted, however, that the data rate, dr, cannot exceed the maximum line rate, $lr_{max}$, minus the redundancy expressed as:

$$dr \leq lr_{max}(1 - \beta).$$

Equating the two equations above, β is solved for to yield the data rate as a function of INP as follows:

$$dr = \frac{16 \cdot mem}{INP_{min}} \beta(1-\beta) \le lr_{max}(1-\beta) \quad \beta < 0.5$$
$$= \frac{4 \cdot mem}{INP_{min}} \quad \beta = 0.5.$$

This yields the following values for β and the data rate:

$$\beta = \min\left\{\frac{lr_{max} \cdot INP_{min}}{16 \cdot mem}, 0.5\right\}$$
$$dr = \frac{16 \cdot mem}{INP_{min}} \beta(1-\beta).$$

Calculating the value of the latency when the maximum data rate is attained for a given INP:

$$\text{Latency} = \frac{S \cdot D}{4}$$
$$INP = \frac{S \cdot D \cdot R}{2 \cdot N} = \text{Latency} \cdot 2 \cdot \beta$$
$$\text{Latency} = \frac{INP}{2 \cdot \beta} = \frac{8 \cdot mem}{lr_{max}} \quad \text{if } \beta < 0.5$$
$$= INP \quad \text{if } \beta = 0.5$$

Thus, it should be noted that, in the case of no constraints, the latency is constant until 50% redundancy is reached, and then becomes proportional to the latency. In practice, for constrained systems with quantified parameters, this forms a lower boundary on the latency expected.

Introducing constraints on $D_{max}$ and $S_{min}$, the case when S is limited from below to some minimum value is first examined:

$$S \ge S_{min}.$$

Transferring this constraint to β:

$$INP = \frac{S \cdot D \cdot R}{2 \cdot N}$$
$$S = \frac{2 \cdot INP}{D \cdot \beta} = \frac{2 \cdot INP \cdot N}{mem \cdot \beta} = \frac{2 \cdot INP \cdot R}{mem \cdot \beta^2} \ge S_{min},$$

which provides, for the largest value of $R=R_{max}$:

$$\beta \le \sqrt{\frac{2 \cdot INP \cdot R_{max}}{mem \cdot S_{min}}}.$$

Considering limiting $D_{max}$, for maximum data rate:

$$D \cdot N = mem$$
$$\frac{D \cdot N}{R} = \frac{mem}{R},$$
$$D = \frac{mem \cdot \beta}{R} \le D_{max}$$

from which, for the largest value or $R=R_{max}$:

$$\beta \le \frac{D_{max} \cdot R_{max}}{mem}.$$

Combining this with the previous equation for β:

$$\beta = \min\left\{\frac{2 \cdot INP_{min} \cdot N_{min}}{mem \cdot S_{min}}, \frac{D_{max} \cdot R_{max}}{mem}, \frac{lr_{max} \cdot INP_{min}}{16 \cdot mem}, 0.5\right\},$$

and the data rate is still provided by:

$$dr = \frac{16 \cdot mem}{INP_{min}} \beta(1-\beta).$$

This provides an exact expression for the data rate as a function of $INP_{min}$, and demonstrates that the data rate is a function of β and the maximum memory, which is a constant. The constraints are all captured by the value of β. This then allows for the computation of a set of integer values for the FEC parameters R, N, and D, such that the rate is maximized for a given $INP_{min}$ using the following steps:

$$\beta = \min\left\{\sqrt{\frac{2 \cdot INP_{min} \cdot R_{max}}{mem \cdot S_{min}}}, \frac{D_{max} \cdot R_{max}}{mem}, \frac{lr_{max} \cdot INP_{min}}{16 \cdot mem}, 0.5\right\}$$
$$N = \text{ceiling}(R_{max} \cdot \beta) \le N_{max}$$
$$R = \text{even integer} \ge \min(N \cdot \beta, R_{max})$$
$$D = \text{integer} \le \left(\frac{mem}{N}\right)$$

Once these parameters are calculated, the value of S can be computed to meet the constraint on $INP_{min}$:

$$S = \min\left\{\frac{2 \cdot INP_{min} \cdot N}{D \cdot R}, \frac{lr_{max}}{32 \cdot N}, S_{min}\right\},$$

as well as the actual inp achieved by the chosen parameters:

$$inp = \frac{S \cdot D \cdot R}{2 \cdot N}.$$

It should be noted that if S is not constrained from below, the constraint on $INP_{min}$ is exactly met. Otherwise, it will typically be exceeded due to the upward rounding of R to the nearest even integer. If the quantification error is too large, some adjustment to R and S is necessary to meet $INP_{min}$, while maximizing the data rate. This is accomplished by testing the next higher value of R and recomputing S to determine the new data rate. If it is larger then the first one chosen, this new value of R is used.

Next, applying the constraint imposed by the convolutional interleaver, the first case is when D is limited to powers of 2 and N is an odd integer, as in G992.3 and G992.5. In this case, the following procedure is used, starting with the integer values of R, N, and D determined above:

$$D' = 2^{round(\log_2(D))}$$

$$N' = \frac{mem}{D'}$$

$$N'' = \text{odd integer} \leq N' \leq N_{max}$$

$$R' = \text{even integer} \geq \beta \cdot N'$$

S is recomputed as before:

$$S = \min\left\{\frac{2 \cdot INP_{min} \cdot N''}{D' \cdot R'}, \frac{lr_{max}}{32 \cdot N''}, S_{min}\right\}.$$

In this case, a situation may arise where $R' > R_{max}$, requiring the adjustment of either R or D as follows:

if $(S \geq 2 \cdot S_{min})$ and $(2 \cdot D' \leq D_{max})$ $$D' = 2 \cdot D'$$

$$N' = \frac{mem}{D'}$$

$$N'' = \text{odd integer} \geq N'$$

$$R' = \text{even integer} \geq \beta \cdot N'$$

else $$R' = R_{max}$$

Recomputing S and inp as before:

$$S = \min\left\{\frac{2 \cdot INP_{min} \cdot N''}{D' \cdot R'}, \frac{lr_{max}}{32 \cdot N''}, S_{min}\right\}.$$

$$inp = \frac{S \cdot D' \cdot R'}{2 \cdot N''}$$

If S is not limited from below, the constraint on $INP_{min}$ is again exactly met. Otherwise, the constraint is exceeded by a large margin and R' is readjusted as follows:

let $S_{limit} = \frac{lr_{max}}{32 \cdot N''}$ if $(S == S_{limit})$ $$R' = \text{even integer} \geq \frac{2 \cdot N'' \cdot INP_{min}}{S_{limit} \cdot D'}.$$

Finally, S and inp are recomputed once more to make sure that the constraint is met. Again, in the case of large quantification errors in R (due to small R values, for example), a neighboring solution with a higher R may have to be examined to achieve the best possible data rate at the given $INP_{min}$.

Next, considering the case of the so-called triangular interleaver used in VDSL:

$$D = M \cdot I + 1 \text{ with } N = q \cdot I.$$

In this case, a number of extra degrees of freedom have been introduced. Again, starting with the integer values of R, N, and D computed above, a convenient, small value of M is chosen and I and q are calculated:

$$I = \text{floor}\left(\frac{D-1}{M}\right)$$

$$q = \text{integer} \leq \frac{N}{I} \geq 1.$$

R, N, and D are then recomputed:

$$N' = q \cdot I$$

$$R' = \text{even integer} \geq \beta \cdot N'.$$

$$D' = M \cdot I + 1$$

Next S and inp are computed, as above:

$$S = \min\left\{\frac{2 \cdot INP_{min} \cdot N''}{D' \cdot R'}, \frac{lr_{max}}{32 \cdot N''}, S_{min}\right\},$$

$$inp = \frac{S \cdot D' \cdot R'}{2 \cdot N''}$$

and it is checked to determine if $inp \geq INP_{min}$. It should noted that, in this case, the value of M may have to be chosen again if the solution is unsatisfactory. Also, the final result may have to be adjusted by searching the nearest value of R for the best possible rate. In general, the granularity of this interleaver is much smaller than that based on D being a factor of 2, thus yielding an optimal result for a judicious choice of M in all cases.

Finally, in the case of the generalized interleaver defined by:

$$D = M \cdot I + x \text{ with } N = q \cdot I \, x = 1, \ldots, I-1.$$

The situation is analogous to the one above, with the added advantage that D can be chosen very close to the original integer value by a proper choice of x. The process in this case is identical to the on above with the modification:

$$I = \text{floor}\left(\frac{D-x}{M}\right),$$

$$q = \text{integer} \leq \frac{N}{I} \geq 1$$

where x is chosen such that D and I are co-prime (i.e. have no common factors). The rest of the procedure is then identical to that described above for the case of the triangular interleaver.

This procedure for choosing the FEC parameters is then applied to one of the conventional methods of bit allocation by using the actual per bin snr (with the snr Gap and the margin added, but no coding gain) to compute the maximum line rate $lr_{max}$ in the above equations. The coding gain due to the FEC obtained is then used to increase the maximum snr, and the FEC parameters are recomputed. This procedure is repeated until no appreciable difference in the FEC parameters results. This process yields the optimal bit allocation and FEC parameters that guarantee meeting all of the system imposed constraints, without conducting an exhaustive search. The procedure can be implemented on a computational engine as part of any xDSL modem, allowing it to achieve optimal performance in the presence of the various system imposed constraints.

Although the present invention has been illustrated and described with reference to preferred embodiments and/or $$inp = \frac{S \cdot D \cdot R}{2 \cdot N}.$$

The invention claimed is:

1. A method for the determination of Forward Error Correction (FEC) parameters in a Discrete Multi-Tone (DMT) based Digital Subscriber Line (xDSL) system, the method comprising:

providing an initial value for each of R (number of check bytes), N (codeword size in bytes), and D (interleaver depth in bytes);

providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and determining a constrained value for each of R, N, and D based upon the set of constraints to maximize line rate for a given $INP_{min}$, wherein $INP_{min}$ comprises the minimum number of DMT symbols for FEC correction, wherein the constrained value for each of R, N, and D is determined through computation based on the initial value of R, N, and D and the set of constraints without operational feedback.

2. The method of claim 1, wherein determining the constrained value for each of R, N, and D comprises determining the constrained value for each of R, N, and D using the following relationships:

$$\beta = \min\left\{\sqrt{\frac{2 \cdot INP_{min} \cdot R_{max}}{mem \cdot S_{min}}}, \frac{D_{max} \cdot R_{max}}{mem}, \frac{lr_{max} \cdot INP_{min}}{16 \cdot mem}, 0.5\right\}$$

$N = \text{ceiling}(R_{max} \cdot \beta) \le N_{max}$ $R = \text{even integer} \ge \min(N \cdot \beta, R_{max})$, $D = \text{integer} \le \left(\frac{mem}{N}\right)$ wherein $INP_{min}$ is minimum number of DMT symbols for FEC correction, $R_{max}$ is maximum number of check bytes, mem is interleaver memory in bytes, $S_{min}$ is minimum number of DMT symbols per FEC codeword, $D_{max}$ is maximum interleaver depth in bytes, $lR_{max}$ is maximum data rate in kbits/sec, and $N_{max}$ is maximum codeword size in bytes.

3. The method of claim 2, further comprising determining an actual number of DMT symbols per FEC codeword using the constrained value for each of R, N, and D and the following relationship:

$$S = \min\left\{\frac{2 \cdot INP_{min} \cdot N}{D \cdot R}, \frac{lr_{max}}{32 \cdot N}, S_{min}\right\}.$$

4. The method of claim 3, further comprising determining an actual number of DMT symbols for FEC correction using the constrained value for each of R, N, and D and the following relationship:

5. The method of claim 4, further comprising, given the constrained value for R and an initial value for each of S and data rate, selecting a next higher even integer value for R, re-determining S and data rate, utilizing the next higher even integer value for R if the re-determined data rate exceeds the initial data rate.

6. The method of claim 5, wherein one of a generalized interleaver and a convolutional interleaver is used.

7. The method of claim 1, further comprising utilizing the FEC parameters in a bit allocation process using an actual per bit SNR, with an SNR gap and a margin added, without coding gain.

8. The method of claim 1, wherein the xDSL system comprises an xDSL modem.

9. The method of claim 8, wherein the method is implemented on a processor internal to the xDSL modem.

10. The method of claim 8, wherein the method is implemented on a processor that is external to the xDSL modem.

11. A Discrete Multi-Tone (DMT) based Digital Subscriber Line (xDSL) system, the system comprising:

a processor operable for determining Forward Error Correction (FEC) parameters, the processor comprising:

a first algorithm operable for providing an initial value for each of R (number of check bytes), N (codeword size in bytes), and D (interleaver depth in bytes);

a second algorithm operable for providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and a third algorithm operable for determining a constrained value for each of R, N, and D based upon the set of constraints to maximize line rate for a given $INP_{min}$, wherein $INP_{min}$ comprises the minimum number of DMT symbols for FEC correction;

wherein the constrained value for each of R, N, and D is determined through computation based on the initial value of R, N, and D and the set of constraints without operational feedback.

12. The system of claim 11, wherein the third algorithm operable for determining the constrained value for each of R, N, and D comprises a third algorithm operable for determining the constrained value for each of R, N, and D using the following relationships:

$$\beta = \min\left\{\sqrt{\frac{2 \cdot INP_{min} \cdot R_{max}}{mem \cdot S_{min}}}, \frac{D_{max} \cdot R_{max}}{mem}, \frac{lr_{max} \cdot INP_{min}}{16 \cdot mem}, 0.5\right\}$$

$N = \text{ceiling}(R_{max} \cdot \beta) \le N_{max}$, $R = \text{even integer} \ge \min(N \cdot \beta, R_{max})$ $D = \text{integer} \le \left(\frac{mem}{N}\right)$ wherein $INP_{min}$ is minimum number of DMT symbols for FEC correction, $R_{max}$ is maximum number of check bytes, mem is interleaver memory in bytes, $S_{min}$ is minimum number of DMT symbols per FEC codeword, $D_{max}$ is maximum interleaver depth in bytes, $lR_{max}$ is maximum data rate in kbits/sec, and $N_{max}$ is maximum codeword size in bytes.

13. The system of claim 12, further comprising a fourth algorithm operable for determining an actual number of DMT symbols per FEC codeword using the constrained value for each of R, N, and D and the following relationship:

$$S = \min\left\{\frac{2 \cdot INP_{min} \cdot N}{D \cdot R}, \frac{lr_{max}}{32 \cdot N}, S_{min}\right\}.$$

14. The system of claim 13, further comprising a fifth algorithm operable for determining an actual number of DMT symbols for FEC correction using the constrained value for each of R, N, and D and the following relationship:

$$inp = \frac{S \cdot D \cdot R}{2 \cdot N}.$$

15. The system of claim 14, further comprising, given the constrained value for R and an initial value for each of S and data rate, a sixth algorithm operable for selecting a next higher even integer value for R, re-determining S and data rate, utilizing the next higher even integer value for R if the re-determined data rate exceeds the initial data rate.

16. The system of claim 15, further comprising one of a generalized interleaver and a convolutional interleaver.

17. The system of claim 11, wherein the xDSL system comprises an xDSL modem.

18. The system of claim 17, wherein the processor is internal to the xDSL modem.

19. The system of claim 17, wherein the processor is external to the xDSL modem.

20. A processor operable for determining Forward Error Correction (FEC) parameters, the processor comprising:
   a first algorithm operable for providing an initial value for each of R (number of check bytes), N (codeword size in bytes), and D (interleaver depth in bytes);
   a second algorithm operable for providing a set of constraints for one or more of maximum interleaver memory in bytes, maximum interleaver depth in bytes, maximum codeword size in bytes, maximum number of check bytes, maximum number of FEC codewords per DMT symbol, minimum number of DMT symbols for FEC correction, interleaver parameters, Signal-to-Noise ratio (SNR) profile, FEC coding gain, and framer parameters; and
   a third algorithm operable for determining a constrained value for each of R, N, and D based upon the set of constraints to maximize line rate for a given $INP_{min}$, wherein $INP_{min}$ comprises the minimum number of DMT symbols for FEC correction, wherein the constrained value for each of R, N, and D is determined through computation based on the initial value of R, N, and D and the set of constraints without operational feedback.

21. The processor of claim 20, wherein the third algorithm operable for determining the constrained value for each of R, N, and D comprises a third algorithm operable for determining the constrained value for each of R, N, and D using the following relationships:

$$\beta = \min\left\{\sqrt{\frac{2 \cdot INP_{min} \cdot R_{max}}{mem \cdot S_{min}}}, \frac{D_{max} \cdot R_{max}}{mem}, \frac{lr_{max} \cdot INP_{min}}{16 \cdot mem}, 0.5\right\},$$

$N = \text{ceiling }(R_{max} \cdot \beta) \leq N_{max}$ $R = \text{even integer} \geq \min(N \cdot \beta, R_{max})$ $D = \text{integer} \leq \left(\frac{mem}{N}\right)$ wherein $INP_{min}$ is minimum number of DMT symbols for FEC correction, $R_{max}$ is maximum number of check bytes, mem is interleaver memory in bytes, $S_{min}$ is minimum number of DMT symbols per FEC codeword, $D_{max}$ is maximum interleaver depth in bytes, $lR_{max}$ is maximum data rate in kbits/sec, and $N_{max}$ is maximum codeword size in bytes.

22. The processor of claim 21, further comprising a fourth algorithm operable for determining an actual number of DMT symbols per FEC codeword using the constrained value for each of R, N, and D and the following relationship:

$$S = \min\left\{\frac{2 \cdot INP_{min} \cdot N}{D \cdot R}, \frac{lr_{max}}{32 \cdot N}, S_{min}\right\}.$$

23. The processor of claim 22, further comprising a fifth algorithm operable for determining an actual number of DMT symbols for FEC correction using the constrained value for each of R, N, and D and the following relationship:

$$inp = \frac{S \cdot D \cdot R}{2 \cdot N}.$$

24. The processor of claim 23, farther comprising, given the constrained value for R and an initial value for each of S and data rate, a sixth algorithm operable for selecting a next higher even integer value for R, re-determining S and data rate, utilizing the next higher even integer value for R if the re-determined data rate exceeds the initial data rate.

25. The processor of claim 24, further comprising one of a generalized interleaver and a convolutional interleaver.

26. The processor of claim 20, wherein the processor is internal to an xDSL modem.

27. The processor of claim 20, wherein the processor is external to an xDSL modem.

* * * * *